(12) United States Patent
Kim et al.

(10) Patent No.: US 12,324,292 B2
(45) Date of Patent: Jun. 3, 2025

(54) APPARATUS AND METHOD FOR SELF-ASSEMBLY OF SEMICONDUCTOR LIGHT-EMITTING ELEMENT

(71) Applicant: LG ELECTRONICS INC., Seoul (KR)

(72) Inventors: Kisu Kim, Seoul (KR); Changseo Park, Seoul (KR); Philwon Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 547 days.

(21) Appl. No.: 17/793,882

(22) PCT Filed: Feb. 13, 2020

(86) PCT No.: PCT/KR2020/002037
§ 371 (c)(1),
(2) Date: Jul. 19, 2022

(87) PCT Pub. No.: WO2021/149862
PCT Pub. Date: Jul. 29, 2021

(65) Prior Publication Data
US 2023/0043559 A1  Feb. 9, 2023

(30) Foreign Application Priority Data
Jan. 22, 2020 (KR) .................. 10-2020-0008863

(51) Int. Cl.
*H10H 29/03* (2025.01)
*H01L 23/00* (2006.01)
(Continued)

(52) U.S. Cl.
CPC ............. *H10H 29/03* (2025.01); *H01L 24/95* (2013.01); *H01L 25/0753* (2013.01);
(Continued)

(58) Field of Classification Search
CPC .................. H10H 29/03; H10H 29/012; H01L 2224/95085; H01L 2224/95133
See application file for complete search history.

(56) References Cited

U.S. PATENT DOCUMENTS 7,727,788 B2 * 6/2010 Han ........................ H01L 25/50
438/30
9,825,202 B2  11/2017 Schuele et al.
(Continued)

FOREIGN PATENT DOCUMENTS

JP    2018-528601 A      9/2018
KR    20190117413 A  * 10/2019
(Continued)

*Primary Examiner* — Daniel Luke
(74) *Attorney, Agent, or Firm* — Birch, Stewart, Kolasch & Birch, LLP

(57) ABSTRACT

A self-assembly apparatus can include a fluid chamber for accommodating a fluid and semiconductor light-emitting elements, a conveyor to convey an assembly substrate so one surface of the assembly substrate is immersed in the fluid, the assembly substrate having a plurality of assembly electrodes, a magnet array spaced apart from the fluid chamber to apply a magnetic force to the semiconductor light-emitting elements, a power supply to apply power to the plurality of assembly electrodes disposed on the assembly substrate so that the semiconductor light-emitting elements are seated in a preset region on the assembly substrate, and a repair substrate disposed to face the one surface of the assembly substrate and including a plurality of pair electrodes on which an electric field is generated as power is supplied. The plurality of pair electrodes can be disposed at the same interval as the plurality of assembly electrodes.

20 Claims, 22 Drawing Sheets

(51) Int. Cl.
*H01L 25/075* (2006.01)
*H10H 29/01* (2025.01)

(52) U.S. Cl.
CPC . *H10H 29/012* (2025.01); *H01L 2224/95085* (2013.01); *H01L 2224/95101* (2013.01); *H01L 2224/95133* (2013.01); *H01L 2224/95136* (2013.01)

(56) References Cited

U.S. PATENT DOCUMENTS

| | | |
|---|---|---|
| 10,032,957 B2 | 7/2018 | Crowder et al. |
| 10,446,728 B2 * | 10/2019 | Sasaki ................. H10H 20/857 |
| 2018/0190614 A1 | 7/2018 | Kumar et al. |
| 2018/0312421 A1 | 11/2018 | Garner et al. |
| 2019/0326144 A1 * | 10/2019 | Shim ..................... B65G 47/92 |
| 2019/0326477 A1 * | 10/2019 | Kim ..................... H01L 25/0753 |
| 2023/0005887 A1 * | 1/2023 | Kwon ..................... H10H 20/01 |

FOREIGN PATENT DOCUMENTS

| | | |
|---|---|---|
| KR | 10-2019-0143840 A | 12/2019 |
| KR | 10-2020-0005516 A | 1/2020 |
| KR | 10-2020-0014867 A | 2/2020 |

* cited by examiner 155 154 153 159

APPARATUS AND METHOD FOR SELF-ASSEMBLY OF SEMICONDUCTOR LIGHT-EMITTING ELEMENT

CROSS REFERENCE TO RELATED APPLICATIONS

This application is the National Stage filing under 35 U.S.C. 371 of International Application No. PCT/KR2020/002037, filed on Feb. 13, 2020, which claims the benefit of earlier filing date and right of priority to Korean Application No. 10-2020-0008863, filed on Jan. 22, 2020, the entire contents of all these applications are hereby expressly incorporated by reference into the present application.

TECHNICAL FIELD

The present disclosure relates to a method for manufacturing a display device, and more particularly, to a method and apparatus for self-assembling semiconductor light-emitting elements having sizes of several to several tens of micrometers (μm).

BACKGROUND ART

In recent years, in the field of display technology, liquid-crystal displays (LCD), organic light-emitting diode (OLED) displays, microLED displays, etc. have been competing to realize large-area displays.

On the contrary, semiconductor microLEDs (μLED) with a diameter or cross-sectional area less than 100 microns, when used in displays, may offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick & place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs. In view of this, the present disclosure proposes a new manufacturing method and apparatus for self-assembling microLEDs.

DISCLOSURE OF INVENTION

Technical Problem

One aspect of the present disclosure is to provide a new manufacturing process that provides high reliability in large-screen displays using micro-sized semiconductor light-emitting elements.

Another aspect of the present disclosure is to provide a manufacturing process, capable of improving transfer accuracy when self-assembling semiconductor light-emitting elements onto an assembly substrate.

Still another aspect of the present disclosure is to provide an apparatus capable of resolving assembly defects after self-assembly, and a manufacturing method thereof.

Solution to Problem

In order to achieve these and other advantages and in accordance with the purpose of this specification, as embodied and broadly described herein, there is provided a self-assembly apparatus for semiconductor light-emitting elements that may include a fluid chamber having a space for accommodating a fluid and semiconductor light-emitting elements, a conveyance unit configured to convey an assembly substrate such that one surface of the assembly substrate is immersed in the fluid, the assembly substrate having a plurality of assembly electrodes, a magnet array spaced apart from the fluid chamber to apply a magnetic force to the semiconductor light-emitting elements, a power supply unit configured to apply power to the assembly electrodes disposed on the assembly substrate so that the semiconductor light-emitting elements are seated in a preset region on the assembly substrate, and a repair substrate disposed to face the one surface of the assembly substrate and including a plurality of pair electrodes on which an electric field is generated as power is supplied. The pair electrodes may be disposed at the same interval as the assembly electrodes.

In one implementation, the apparatus may further include a controller configured to control the power supply unit, and the controller may control the power supply unit to supply power to at least some of the pair electrodes such that some of semiconductor light-emitting elements seated at preset positions on the assembly substrate are moved to the repair substrate after the semiconductor light-emitting elements are seated at the preset positions on the assembly substrate.

In one implementation, the controller may selectively apply power to only some pair electrodes adjacent to a region where the assembly defect has occurred in an entire region of the assembly substrate.

In one implementation, the apparatus may further include a substrate conveyance unit disposed in the fluid chamber and configured to feed the repair substrate in the fluid.

In one implementation, the controller may apply power even to the assembly electrodes while applying power to at least some of the pair electrodes.

In one implementation, the controller may apply power to at least some of the pair electrodes so that strength of an electric field generated between the pair electrodes is greater than strength of an electric field generated between the assembly electrodes.

In one implementation, the repair substrate may include barrier walls for guiding the semiconductor light-emitting elements, and the controller may apply power to at least some of the pair electrodes so that some of the semiconductor light-emitting elements seated on the assembly substrate are seated between the barrier walls disposed on the repair substrate.

In one implementation, when at least one of the semiconductor light-emitting elements seated between the barrier walls disposed on the repair substrate satisfies a preset condition, the controller may cut off power applied to pair electrodes adjacent to the semiconductor light-emitting element that satisfies the preset condition.

In one implementation, the controller may cut off power applied to the pair electrodes adjacent to the semiconductor light-emitting element satisfying the preset condition, in a state where the semiconductor light-emitting element satisfying the preset condition overlaps a region in which any semiconductor light-emitting element is not seated in a preset region of the assembly substrate.

In one implementation, the apparatus may further include an image sensor configured to monitor the repair substrate, and the controller may cut off power applied to the pair electrodes adjacent to the semiconductor light-emitting element satisfying the preset condition, based on a sensing result of the image sensor.

Also, the present disclosure provides a method for assembling semiconductor light-emitting elements at preset positions in a fluid chamber accommodating a fluid and the semiconductor light-emitting elements. Specifically, the present disclosure provides a method for manufacturing a display device that may include feeding an assembly substrate such that one surface of the assembly substrate is immersed in the fluid, the assembly substrate having a plurality of assembly electrodes, generating an electric field between the assembly electrodes to guide movement of the semiconductor light-emitting elements in the fluid chamber and assemble the semiconductor light-emitting elements at preset positions on the assembly substrate by using a magnetic substance, feeding the repair substrate to overlap the assembly substrate, the repair substrate having a plurality of pair electrodes, and generating an electric field between the pair electrodes so that a semiconductor light-emitting element mis-assembled on the assembly substrate is moved to the repair substrate.

In one implementation, the method may further include cutting off the electric field generated between the pair electrodes, such that the semiconductor light-emitting element moved to the repair substrate is moved back to the assembly substrate, when the semiconductor light-emitting element moved to the repair substrate satisfies a preset condition.

Advantageous Effects of Invention

With the above configuration according to the present disclosure, a large number of semiconductor light-emitting elements can be assembled at a time in a display device where individual pixels are made up of microLEDs.

As such, a large number of semiconductor light-emitting elements can be pixelated on a small-sized wafer and then transferred onto a large-area substrate. This enables the manufacture of a large-area display device at a low cost.

Moreover, according to the manufacturing method of the present disclosure, a low-cost, high-efficiency, and quick transfer of semiconductor light-emitting elements can be done, regardless of the sizes or numbers of parts and the transfer area, by simultaneously transferring them in the right positions by using a magnetic field and an electric field.

Furthermore, the assembling of semiconductor light-emitting elements by an electric field allows for selective assembling through selective electrical application without additional equipment or processes. Also, since an assembly substrate is placed on a top of a chamber, the substrate can be easily loaded or unloaded, and non-specific binding of semiconductor light-emitting elements can be prevented.

According to the present disclosure, since a physical contact with semiconductor light-emitting elements in the process of removing mis-assembled semiconductor light-emitting elements does not occur, an assembly defect can be resolved without damaging the semiconductor light-emitting elements.

In addition, since the mis-assembled semiconductor light-emitting elements can be reassembled immediately after being collected, costs and time required for resolving assembly defects can be reduced.

MODE FOR THE INVENTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head mounted display (HMD), a desktop computer, and the like. However, it will be readily apparent to those skilled in the art that the configuration according to the implementations described herein may also be applied to a new product type that will be developed later if the device is a device capable of emitting light.

Figure 1:
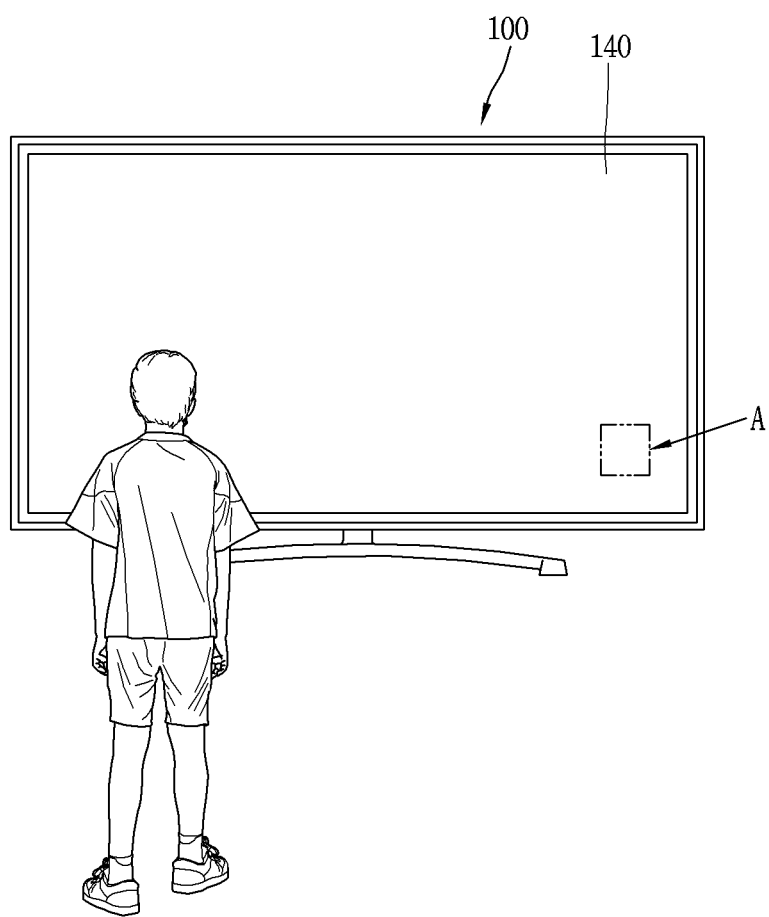
FIG. 1 is a conceptual view showing a display device using a semiconductor light-emitting element according to an implementation of the present disclosure.
Figure 2:
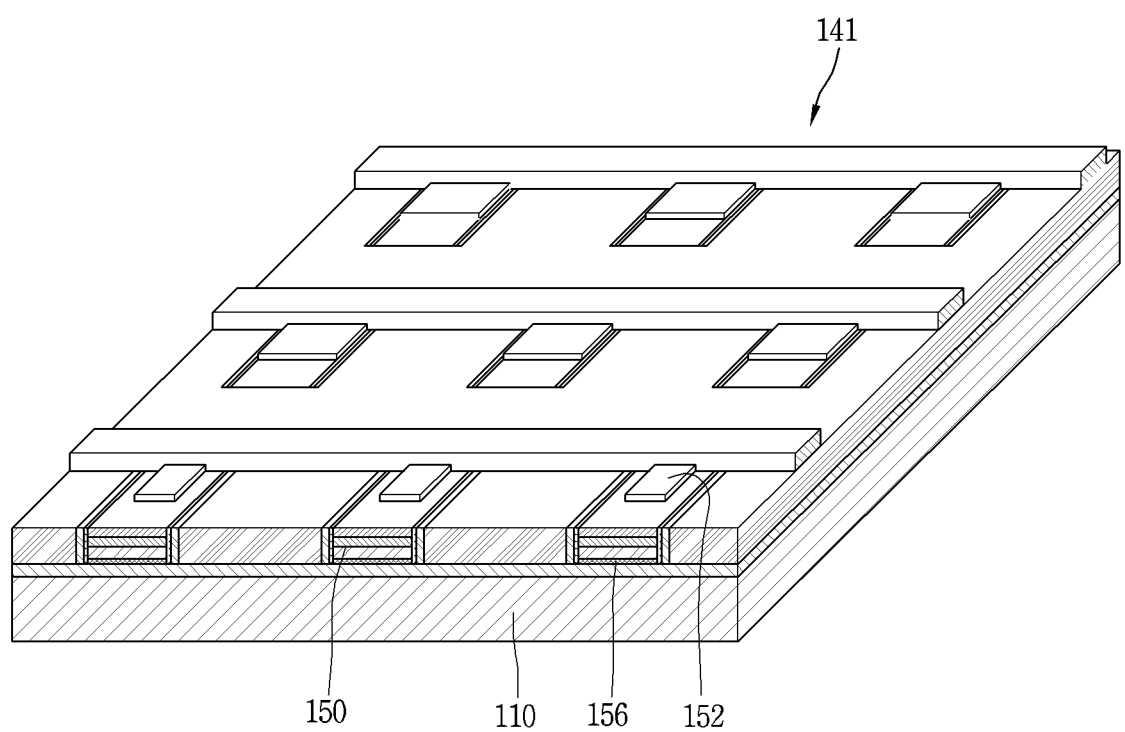
FIG. 2 is a partial enlarged view of the portion A in the display device of FIG. 1.
Figure 3:
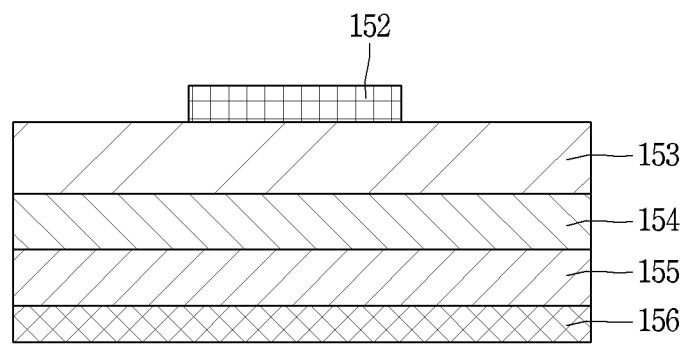
FIG. 3 is an enlarged view of the semiconductor light-emitting element of FIG. 2.
Figure 4:
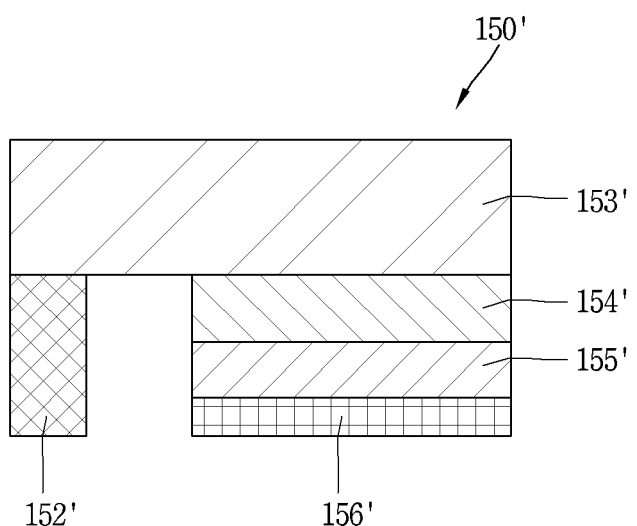
FIG. 4 is an enlarged view illustrating another implementation of the semiconductor light-emitting element of FIG. 2.

FIG. 1 is a conceptual view illustrating one implementation of a display device using semiconductor light-emitting elements, FIG. 2 is a partial enlarged view of the portion A in the display device of FIG. 1, FIG. 3 is an enlarged view of the semiconductor light-emitting element of FIG. 2, and FIG. 4 is an enlarged view illustrating another implementation of the semiconductor light-emitting element of FIG. 2.

As illustrated, information processed by a controller of a display device 100 may be output on a display module 140. A closed loop-shaped case 101 that runs around the edge of the display module 140 may define the bezel of the display device.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels (sub-pixels) arranged in a matrix configuration independently through the wirings.

The present disclosure takes microLEDs (light-emitting diodes) as an example of the semiconductor light-emitting elements 150 which convert current into light. The microLEDs may be light-emitting elements that are small in size less than 100 micron meters. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, the semiconductor light-emitting elements 150 may be implemented as high-power light-emitting elements that are composed mostly of gallium nitride (GaN), with some indium (In) and/or aluminum (Al) added to it, and emit light of various colors.

Such a vertical semiconductor light-emitting element may include a p-type electrode 156, a p-type semiconductor layer 155 disposed on the p-type semiconductor layer 156, an active layer 154 disposed on the p-type semiconductor layer 155, an n-type semiconductor layer 153 disposed on the active layer 154, and an n-type electrode 152 disposed on the n-type semiconductor layer 153. In this case, the p-type electrode 156 at the bottom may be electrically connected to a p-electrode of the wiring substrate, and the upper n-type electrode 152 at the top may be electrically connected to an n-electrode above the semiconductor light-emitting element. The electrodes can be disposed in an upward/downward direction in the vertical semiconductor light-emitting element 150, thereby providing a great advantage of reducing a chip size.

In another example, referring to FIG. 4, the semiconductor light-emitting diodes may be flip chip-type light-emitting diodes.

As an example of such a flip chip-type light-emitting diode, the semiconductor light-emitting diode 250 comprises a p-type electrode 256, a p-type semiconductor layer 255 formed on the p-type semiconductor layer 256, an active layer 254 formed on the p-type semiconductor layer 255, an n-type semiconductor layer 253 formed on the active layer 254, and an n-type electrode 252 vertically separated from the p-type electrode 256, on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a horizontal light-emitting element each may be used as a green semiconductor light-emitting element, blue semiconductor light-emitting element, or red semiconductor light-emitting element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example of such high-power light-emitting diodes, the semiconductor light-emitting diodes may be composed of gallium nitride thin films which are formed of various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting diodes, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. In this case, the micro-sized semiconductor light-emitting elements 150 should be transferred onto a wafer, at preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) semiconductor light-emitting elements will be illustrated. It should be noted that the illustration given below is also applied to active matrix (AM) semiconductor light-emitting diodes. Also, although the illustration will be given of how horizontal semiconductor light-emitting diodes are self-assembled, it may also be applied to self-assembling of vertical semiconductor light-emitting diodes.

Figure 5A:
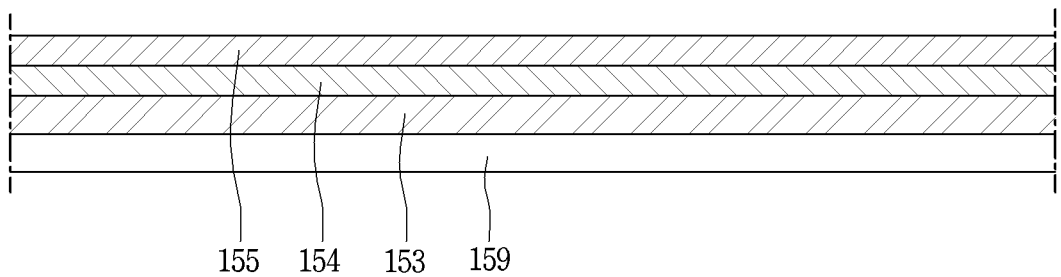
FIGS. 5A to 5E are conceptual views illustrating a new process for manufacturing the semiconductor light-emitting elements (or diodes).

First of all, according to the manufacturing method, a first conductive semiconductor layer 153, an active layer 154, and a second conductive semiconductor layer 155 may be grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not necessarily limited to this, and the first conductive type may be n-type and the second conductive type may be p-type.

Moreover, although this exemplary implementation is illustrated by assuming the presence of the active layer, the active layer may be omitted if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. In addition, the growth substrate 159 may be made of a material suitable for growing a semiconductor material, namely, a carrier wafer. The growth substrate 2101 may also be formed of a material having high thermal conductivity. The growth substrate 2101 may use at least one of a SiC substrate having higher thermal conductivity than the sapphire (Al2O3) substrate, Si, GaAs, GaP, InP and Ga2O3, in addition to a conductive substrate or an insulating substrate.

Figure 5B:
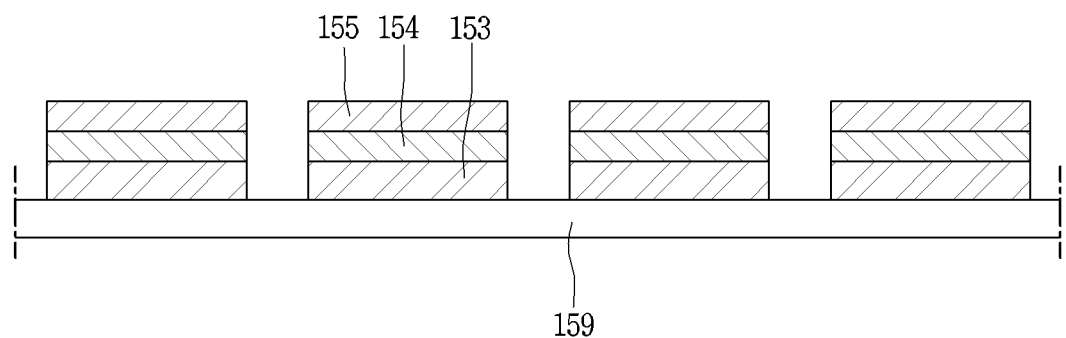

Next, a plurality of semiconductor light-emitting diodes are formed by removing at least part of the first conductive semiconductor layer 153, active layer 154, and second conductive semiconductor layer 155 (FIG. 5B).

More specifically, isolation may be performed so that the plurality of light-emitting elements form a light-emitting diode array. That is, a plurality of semiconductor light-emitting diodes are formed by vertically etching the first conductive semiconductor layer 153, active layer 154, and second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
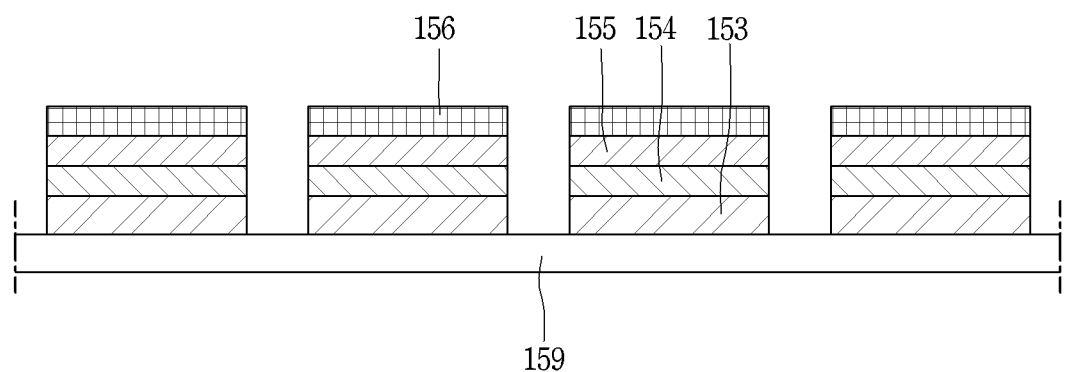

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
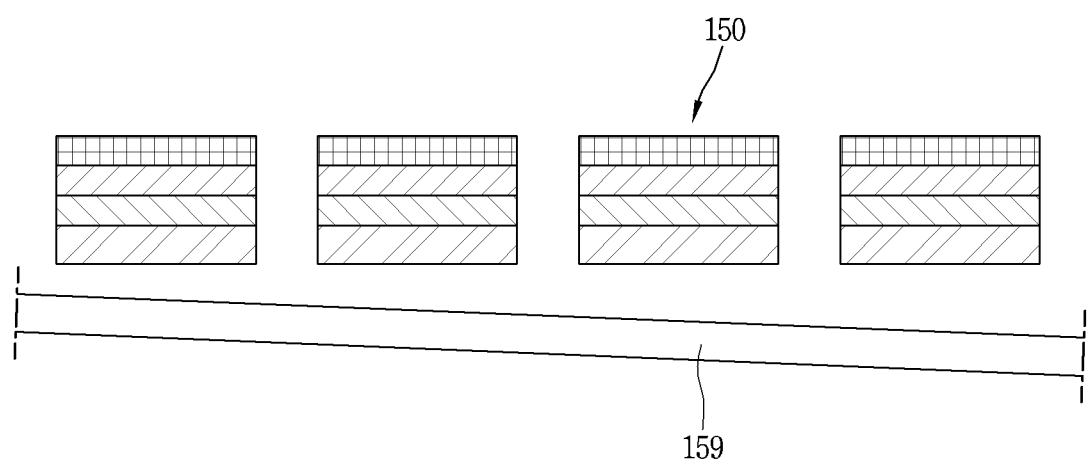

Next, the growth substrate 159 may be removed, thus leaving a plurality of semiconductor light-emitting elements. For example, the growth substrate 159 may be removed using laser lift-off (LLO) or chemical lift-off (CLO) (FIG. 5D).

Figure 5E:
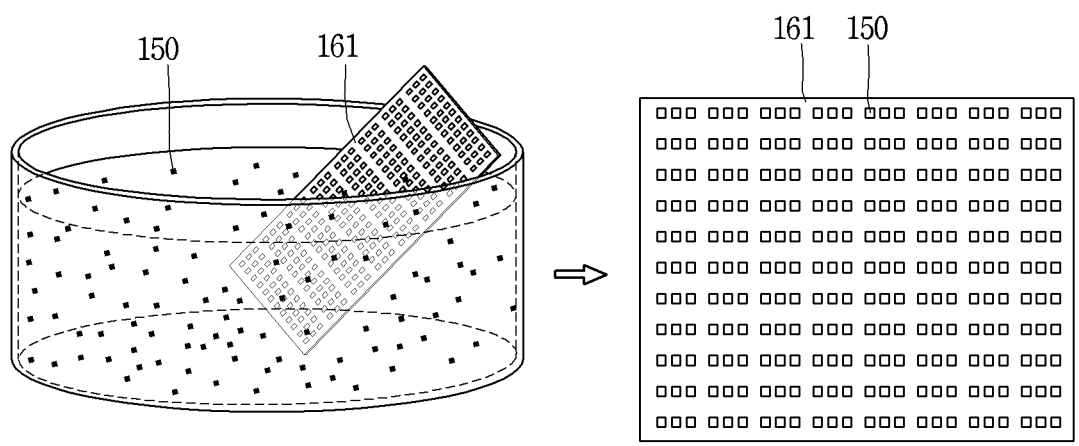

Afterwards, the step of mounting the semiconductor light-emitting elements 150 on a substrate in a chamber filled with a fluid may be performed (FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting diodes 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting diodes 150 onto the assembly substrate 161, cells (not shown) into which the semiconductor light-emitting diodes 150 are fitted may be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more detail below with reference to the accompanying drawings.

Figure 6:
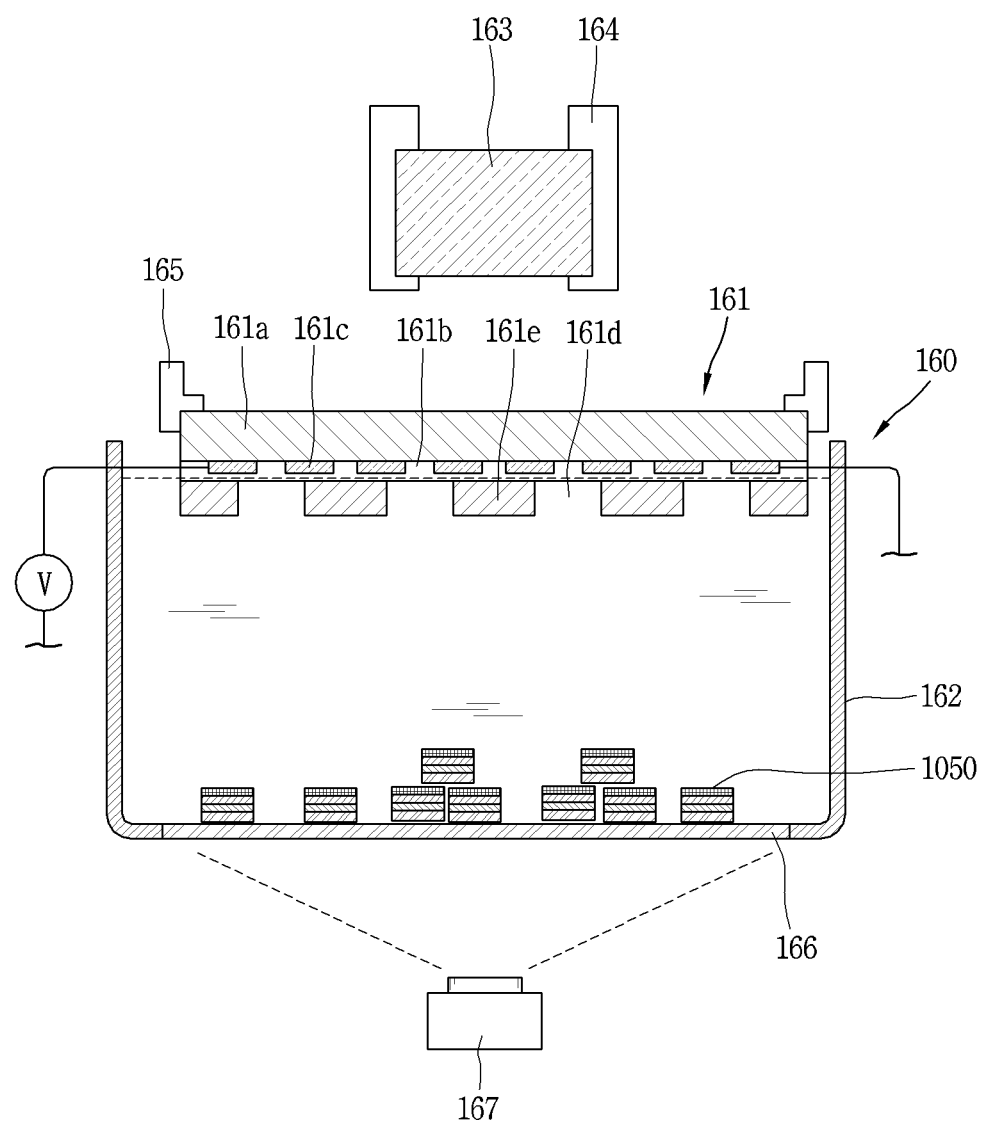
FIG. 6 is a conceptual diagram illustrating an example of a device for self-assembling semiconductor light-emitting elements.
Figure 7:
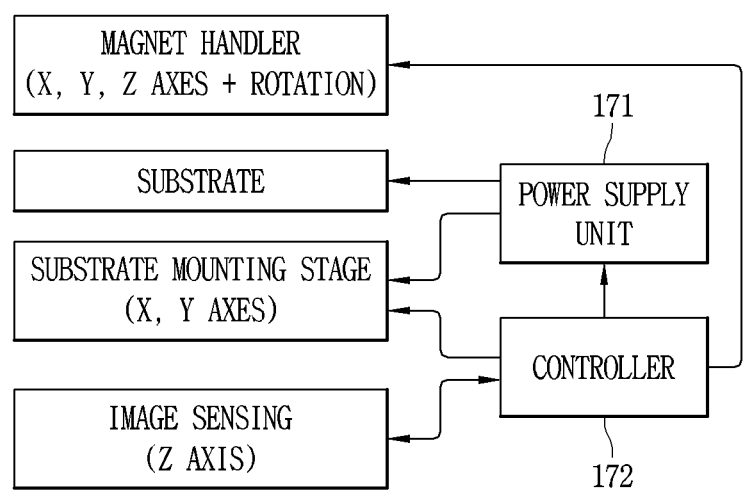
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161a, a dielectric layer 161b, and a plurality of electrodes 161c.

The base portion 161a may be made of an insulating material, and the plurality of electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of an inorganic material such as $SiO_2$, $SiNx$, $SiON$, $Al_2O_3$, $TiO_2$, $HfO_2$, etc. Alternatively, the dielectric layer 161b may be an organic insulator and configured as a single layer or multi-layers. The thickness of the dielectric layer 161b may range from several tens of nm to several μm.

Further, the substrate 161 according to the present disclosure may include a plurality of cells 161d that are separated by barrier walls 161e. The cells 161d may be sequentially arranged in one direction and made of polymer material. Also, the barrier walls 161e defining the cells 161d may be shared by neighboring cells 161d. The barrier walls 161e may protrude from the base portion 161a, and the cells 161d may be sequentially arranged in one direction along the barrier walls 161e. More specifically, the cells 161d may be sequentially arranged in column and row directions and have a matrix configuration.

As illustrated in the drawings, the cells 161d may have recesses for receiving the semiconductor light-emitting elements 150, and the recesses may be spaces defined by the barrier walls 161e. The recesses may have a shape identical or similar to the shape of the semiconductor light-emitting elements. For example, if the semiconductor light-emitting elements are rectangular, the recesses may be rectangular too. Moreover, although not shown, the recesses formed in the cells may be circular if the semiconductor light-emitting diodes are circular. Further, each cell may be configured to receive one semiconductor light-emitting element. That is, one cell may receive one semiconductor light-emitting element.

Meanwhile, the plurality of electrodes 161c may have a plurality of electrode lines that are placed at the bottom of the cells 161d, and the electrode lines may extend to neighboring cells.

The plurality of electrodes 161c may be placed beneath the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c beneath each cell 161d, an electric field may be formed and the semiconductor light-emitting elements can be inserted into the cells 161d by the electric field.

The electrodes of the substrate 161 at the assembly site may be electrically connected to a power supply unit 171. The power supply unit 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting diode may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056a and a second layer 1056b, as illustrated in FIG. 9. Here, the first layer 1056a may include a magnetic material, and the second layer 1056b may include a metal material other than the magnetic material.

As shown in the drawing, in this example, the first layer 1056a comprising the magnetic material may be placed in contact with the second conductive semiconductor layer 1055. In this case, the first layer 1056a may be disposed between the second layer 1056b and the second conductive semiconductor layer 1055. The second layer 1056b may be a contact metal that is connected to the wiring electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
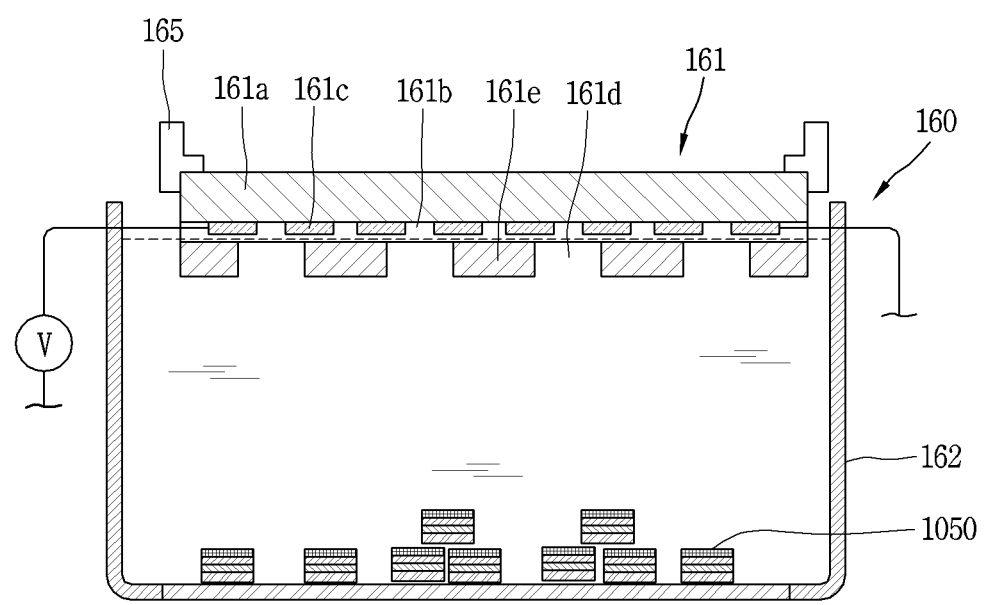
FIGS. 8A to 8E are conceptual view illustrating a process for self-assembling semiconductor light-emitting elements using the self-assembly device of FIG. 6.
Figure 9:
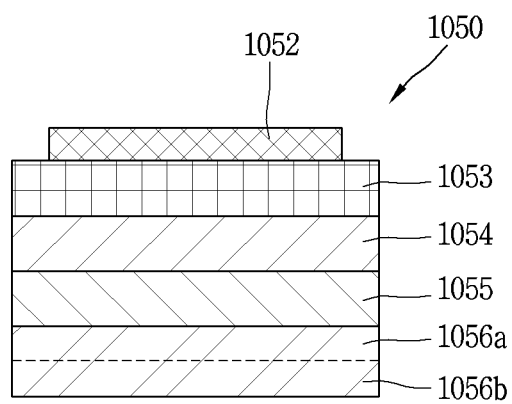
FIG. 9 is a conceptual view illustrating the semiconductor light-emitting element of FIGS. 8A to 8E.

Next, the substrate 161 is fed to an assembly site, and the semiconductor light-emitting diodes 1050 are put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. The fluid chamber 162 may be provided with the light-transmissive bottom plate 166, and some of the semiconductor light-emitting elements 1050 may sink to the bottom plate 166.

Figure 8B:
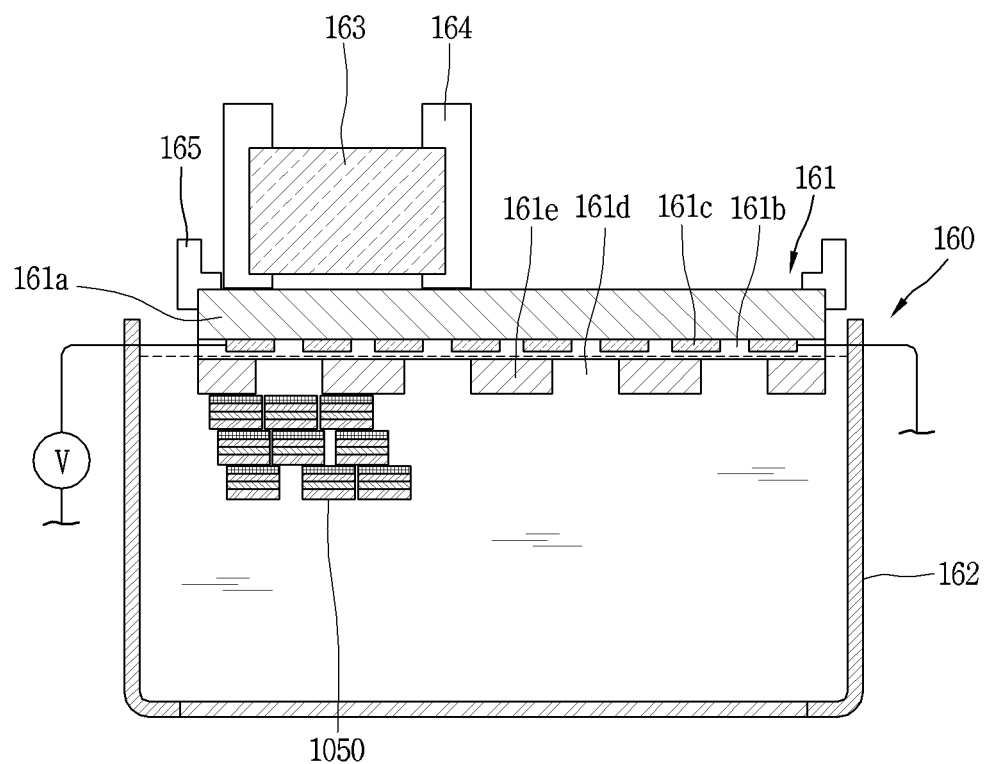

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this implementation, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
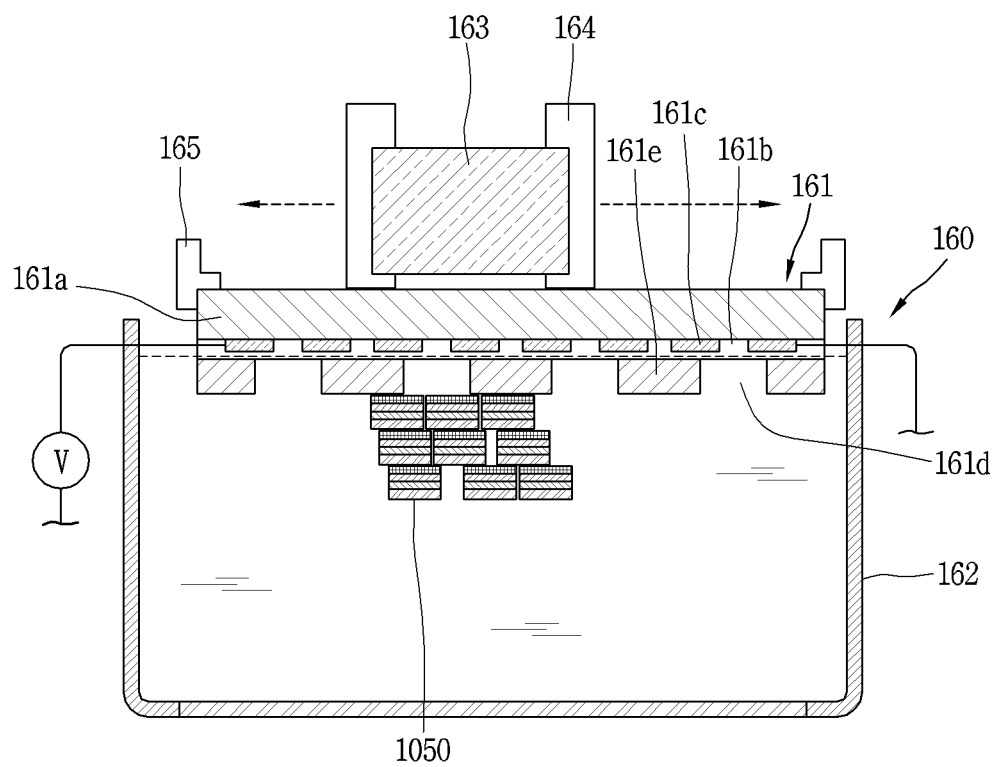

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
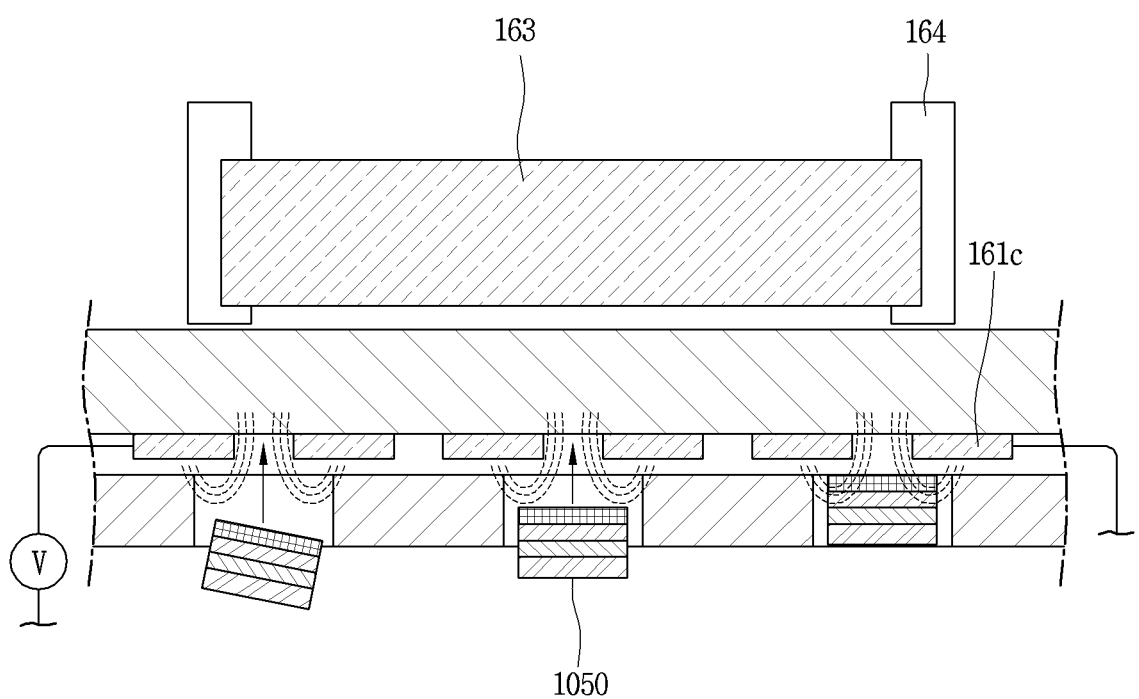
Figure 8E:
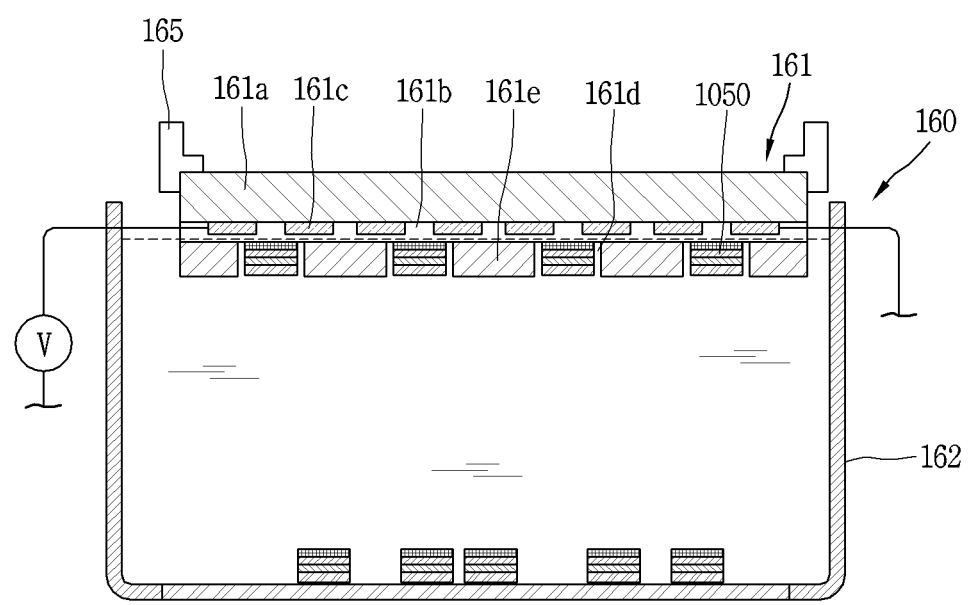

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

Meanwhile, although the aforementioned self-assembly method has very high assembly accuracy, the semiconductor light-emitting elements may not be arranged at preset positions or may not be disposed in a designated orientation with a very low probability. That is, assembly defects may occur with a very low probability during a self-assembly process.

In the case of a large-area display device, since hundreds or tens of millions of semiconductor light-emitting elements are transferred, the number of defective pixels may not be negligible even though the assembly defect probability is very low. For this reason, there is a need for a way capable of resolving assembly defects after self-assembly.

The present disclosure describes an apparatus and method capable of resolving assembly defects after self-assembly. In order to resolve assembly defect after self-assembly, a self-assembly apparatus according to the present disclosure may include a repair substrate configured to be movable in a fluid chamber.

Hereinafter, the repair substrate will be described.

Figure 10:
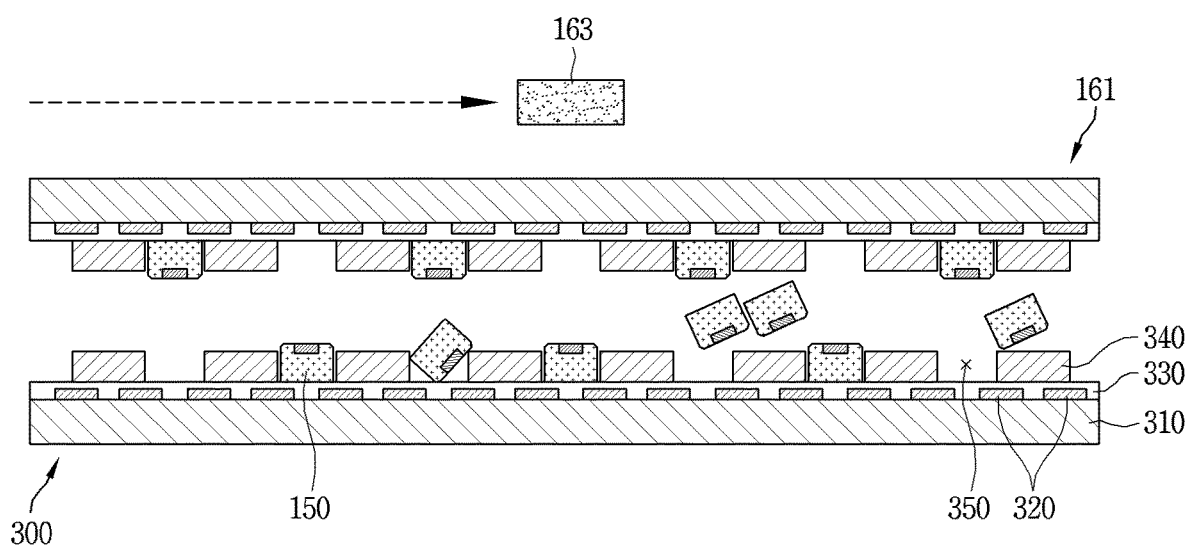
FIG. 10 is a conceptual view illustrating a state in which an assembly substrate and a repair substrate overlap each other.
Figure 11:
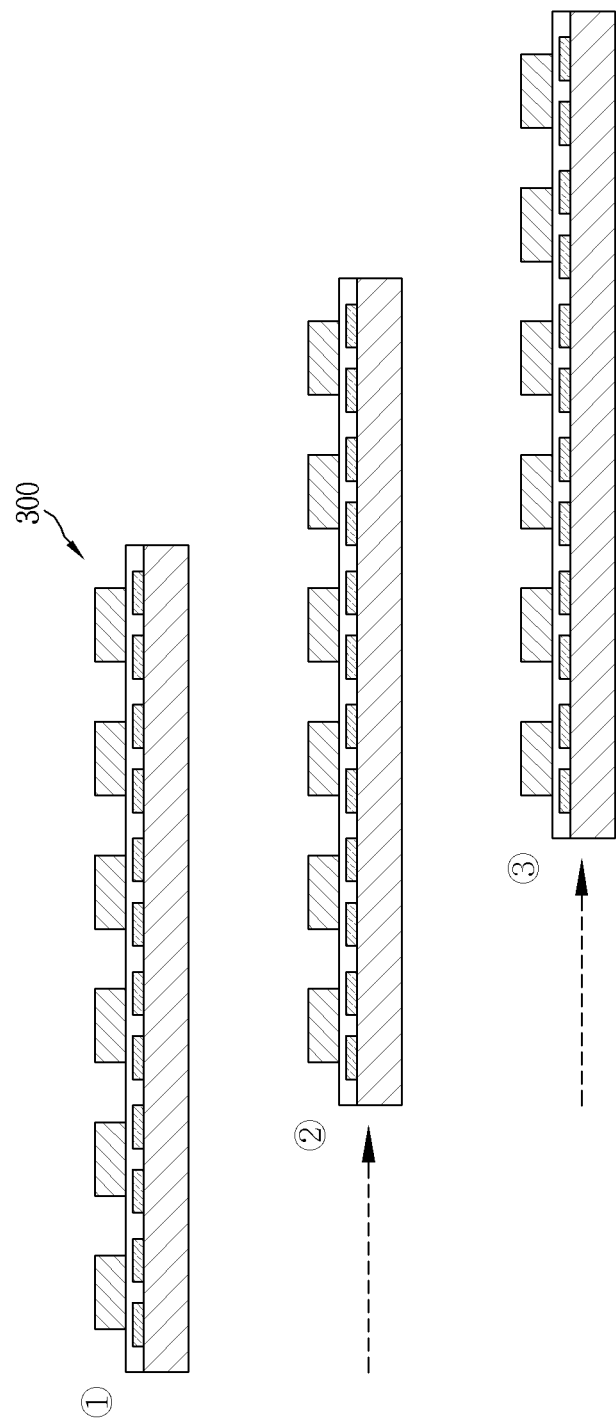
FIG. 11 is a conceptual view illustrating a state in which a repair substrate is fed.

FIG. 10 is a conceptual view illustrating a state in which an assembly substrate and a repair substrate overlap each other and FIG. 11 is a conceptual view illustrating a state in which a repair substrate is fed.

The repair substrate 300 may have the same or similar structure to the assembly substrate described above. Specifically, referring to FIG. 10, the repair substrate 300 may be a substrate capable of producing an electric field, and may include a base portion 310, a plurality of pair electrodes 320, and a dielectric layer 330.

The base portion 310 may be made of an insulating material. In one implementation, the base portion 310 of the repair substrate 300 may be made of the same material as the base portion 161a provided on the aforementioned assembly substrate 161.

The plurality of pair electrodes 320 may be thin films or thick bi-planar electrodes patterned on one surface of the base portion 310. The electrodes may be formed of a stack of Ti/Cu/Ti, Ag paste, ITO, etc. In one implementation, the pair electrodes 320 formed on the repair substrate 300 may be made of the same material as the electrodes formed on the assembly substrate 161. Meanwhile, the pair electrodes 320 may be disposed at the same interval as the electrodes formed on the assembly substrate 161.

The dielectric layer 330 may prevent the pair electrodes 320 from being oxidized when the pair electrodes 320 are immersed in a fluid for a long time. The dielectric layer 161b may be made of an inorganic material such as SiO2, SiNx, SiON, Al2O3, TiO2, HfO2, etc. Alternatively, the dielectric layer 330 may be made of a single layer or multiple layers as an organic insulator. A thickness of the dielectric layer 330 may be several tens of nanometers (nm) to several micrometers (µm). In one implementation, the dielectric layer 330 formed on the repair substrate 300 may be made of the same material as the dielectric layer 161b formed on the assembly substrate 161. However, the dielectric layer 330 may not be an essential component of the repair substrate.

In addition, the repair substrate 300 may include a plurality of cells that are partitioned by barrier walls 340. The cells may be sequentially arranged in one direction and made of a polymer material. Furthermore, the barrier walls defining the cells may be made to be shared with neighboring cells. The barrier walls 340 may protrude from the base portion 310, and the cells may be sequentially arranged in one direction by the barrier walls 340. More specifically, the cells may be sequentially arranged in column and row directions and have a matrix configuration.

In each of the cells, like the assembly substrate 161, a groove 350 for accommodating a semiconductor light-emitting element may be formed. The groove 350 may be a space defined by the barrier walls 340. The shape of the groove 350 may be the same as or similar to that of the semiconductor light-emitting element 150. When the semiconductor light-emitting element 150 has a rectangular shape, the groove 350 may have a rectangular shape. In addition, although not illustrated, when the semiconductor light-emitting element has a circular shape, the groove 350 defined inside the cell 1070 may be formed in a circular shape. Further, each cell may be configured to receive one semiconductor light-emitting element. That is, one cell may receive one semiconductor light-emitting element.

Meanwhile, the plurality of pair electrodes 320 may have a plurality of electrode lines that are placed on bottoms of the cells 161d, and the plurality of electrode lines may extend to neighboring cells.

The plurality of pair electrodes 320 may be placed beneath the cells, and different polarities may be applied to create an electric field within the cells. To create the electric field, the dielectric layer 330 may cover the plurality of electrodes, and the dielectric layer 330 may thus form the bottoms of the cells. With this structure, when different polarities are applied to a pair of electrodes from a lower side of each cell, an electric field may be formed and the semiconductor light-emitting element 150 can be inserted into the cell by the electric field.

In summary, the repair substrate 300 may be the same as the assembly substrate 161 or may differ from the assembly substrate 161 only in some configurations.

The pair electrodes 320 provided on the repair substrate 300 may be electrically connected to the power supply unit 171. The power supply unit 171 may perform a function of generating the electric field by applying power to the plurality of pair electrodes 320.

The power supply unit 171 may apply power to each of the assembly electrodes 161e provided on the assembly substrate 161 and the pair electrodes 320 provided on the repair substrate 300. The controller 172 may control the power supply unit 171 to selectively apply power to the assembly electrodes 161e and the pair electrodes 320.

Meanwhile, the repair substrate 300 may be configured to be movable in the fluid. To this end, the self-assembly apparatus according to the present disclosure may further include a substrate feeding (or conveyance) unit configured to feed (or convey) the repair substrate 300 in the fluid. The substrate feeding unit may feed the repair substrate 300 horizontally and vertically with respect to the bottom surface of the fluid chamber. Since the substrate feeding unit uses a known device, a detailed description thereof will be omitted.

In one implementation, as illustrated in FIG. 11, the substrate feeding unit may feed (supply, convey) the repair substrate 300 horizontally with respect to the bottom surface of the fluid chamber.

Before self-assembly starts, during self-assembly, or after self-assembly ends, the substrate feeding unit may feed the repair substrate 300 to face the assembly substrate 161. Accordingly, the repair substrate 300 may be disposed to face the assembly substrate 161 while being immersed in the fluid in the fluid chamber.

Even when the repair substrate 300 is disposed to overlap the assembly substrate 161 before or during self-assembly, the controller 172 may control the power supply unit 171 not to apply power to the pair electrodes 320 disposed on the repair substrate. This may be to prevent a magnetic field generated on the repair substrate 300 from adversely affecting self-assembly.

After self-assembly is completed and the semiconductor light-emitting elements are seated at preset positions on the assembly substrate, the controller 172 may apply power to at least some of the pair electrodes 320 such that some of the semiconductor light-emitting elements seated on the assembly substrate 161 are moved to the repair substrate 300.

As the controller 172 applies power to at least some of the pair electrodes 320, an electric field may be formed between the pair electrodes 320. A distance between the semiconductor light-emitting elements seated at the preset positions of the assembly substrate 161 and the pair electrodes 320 may be longer than a distance between the semiconductor light-emitting elements seated at the preset positions of the assembly substrate 161 and the assembly electrodes. Therefore, even if the electric field is generated on the repair substrate 300, the semiconductor light-emitting elements assembled at the correct positions may not be moved to the repair substrate 300.

On the other hand, when the semiconductor light-emitting elements are not seated at the preset positions or not seated at the preset positions in a correct orientation, the semiconductor light-emitting elements may be relatively less affected by an electric field generated on the assembly substrate. Accordingly, when the electric field is generated on the repair substrate, mis-assembled semiconductor light-emitting elements may be moved to the repair substrate.

Meanwhile, the controller may selectively apply power to only some pair electrodes adjacent to a region where the assembly defect has occurred in an entire region of the assembly substrate. This may be to minimize the influence of the repair substrate on pre-assembled semiconductor light-emitting elements.

The assembly defect may be determined based on a sensing result of the image sensor 167. Here, the assembly defect (or assembly failure or badness) means that the semiconductor light-emitting elements are seated at different positions other than the preset positions, seated at the preset positions with being upside down, or seated at the preset positions in partially damaged states.

The controller 172 may apply power even to the assembly electrodes 161b while applying power to at least some of the pair electrodes. This can prevent the semiconductor light-emitting elements seated at the preset positions after self-assembly from being separated due to the electric field generated on the repair substrate 300.

Meanwhile, the controller 172 may apply power to at least some of the pair electrodes 320 so that strength of the electric field generated between the pair electrodes can be greater than strength of the electric field generated between the assembly electrodes 161b. The distance between the semiconductor light-emitting elements mis-assembled on the assembly substrate 161 and the pair electrodes 320 may have no choice but to be greater than the distance between the semiconductor light-emitting elements seated at the preset positions on the assembly substrate 161 and the assembly electrodes. In order to for the mis-assembled semiconductor light-emitting elements to be moved to the repair substrate 300, the strength of the electric field generated on the repair substrate 300 must be greater than the strength of the electric field generated between the assemble electrodes.

In one implementation, the controller 172 may control magnitude of a voltage applied between the pair electrodes 320 to be greater than magnitude of a voltage applied between the assembly electrodes 161b, so that the strength of the electric field generated between the pair electrodes 320 can be greater than the strength of the electric field generated between the assembly electrodes 161b.

Meanwhile, the semiconductor light-emitting elements moved to the repair substrate 300 may be seated between the barrier walls 340 disposed on the repair substrate 300. Accordingly, the semiconductor light-emitting elements seated between the barrier walls 340 can be strongly fixed to the repair substrate 300.

The semiconductor light-emitting elements seated on the repair substrate 300 may be reused or discarded.

Figure 12:
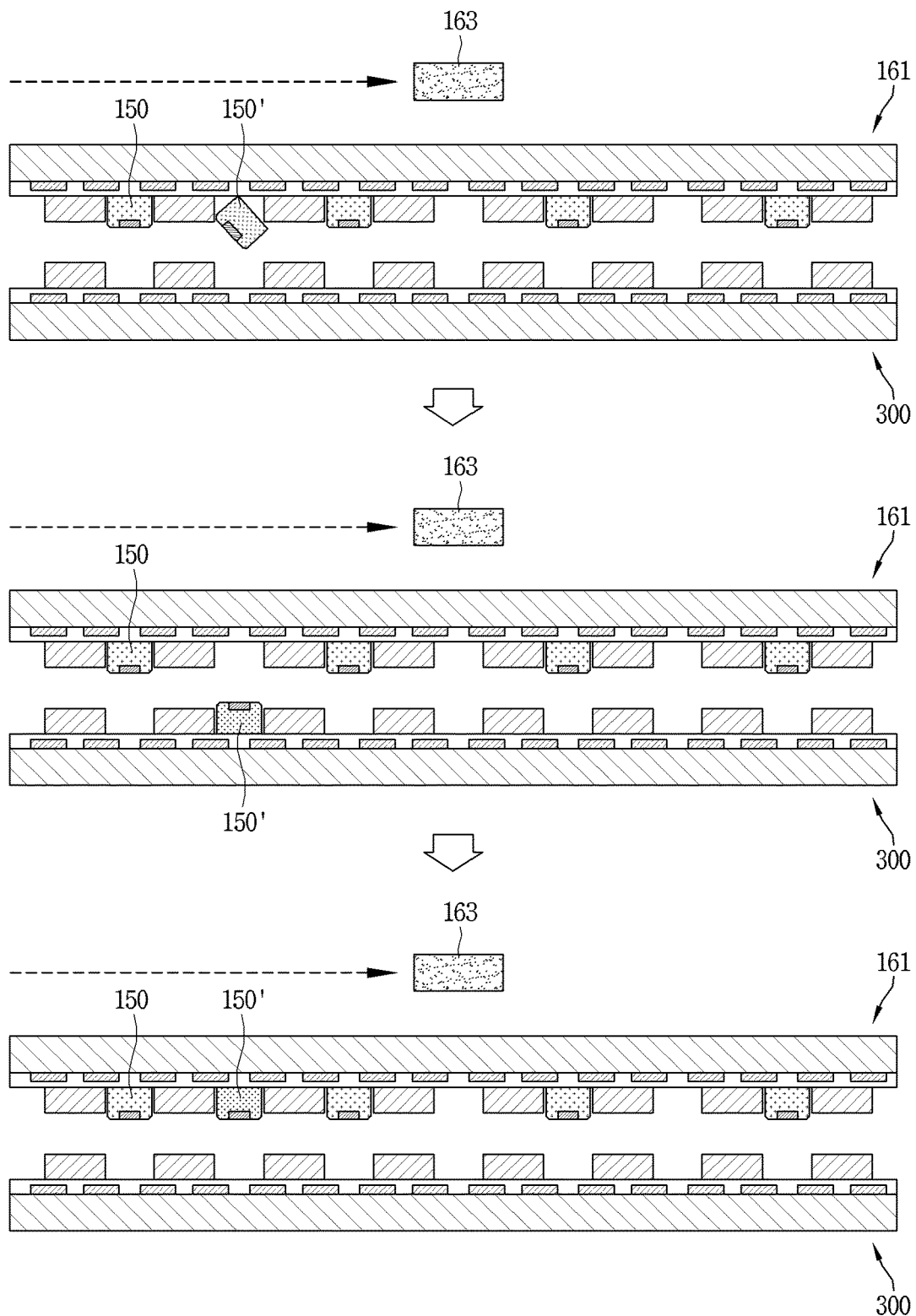
FIG. 12 is a conceptual view illustrating an implementation of reusing a mis-assembled semiconductor light-emitting element.
Figure 13:
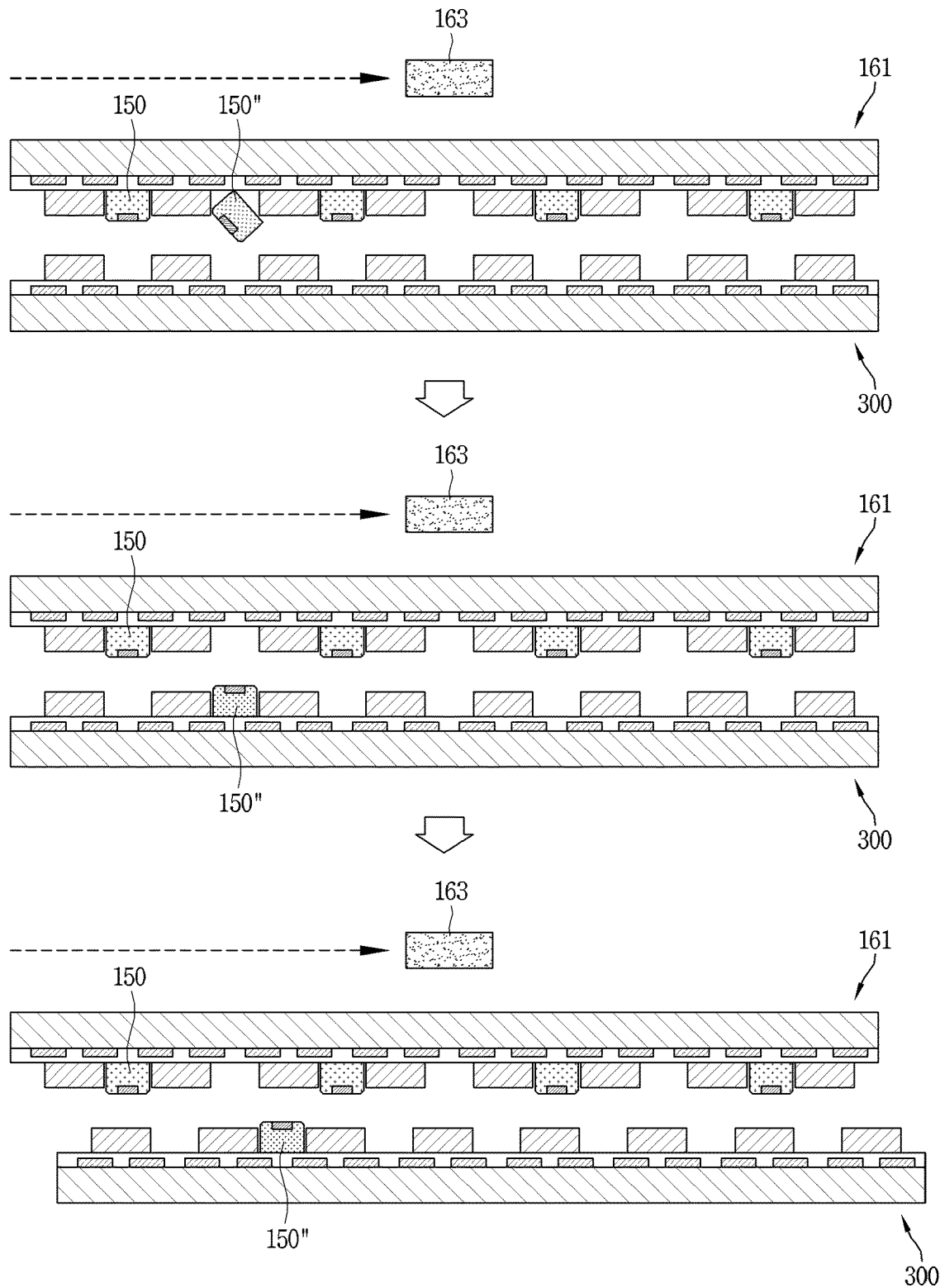
FIG. 13 is a conceptual view illustrating an implementation of discarding a mis-assembled semiconductor light-emitting element.

FIG. 12 is a conceptual view illustrating an implementation of reusing a mis-assembled semiconductor light-emitting element and FIG. 13 is a conceptual view illustrating an implementation of discarding a mis-assembled semiconductor light-emitting element.

First, one implementation of reusing a semiconductor light-emitting element seated on the repair substrate will be described. Referring to FIG. 12, some semiconductor light-emitting elements 150' may be mis-assembled after self-assembly is completed. The mis-assembled semiconductor light-emitting elements may be moved to the repair substrate 300 due to the electric field generated on the repair substrate 300 and seated between the barrier walls 340.

The semiconductor light-emitting elements 150' seated on the repair substrate 300 may be reassembled on the assembly substrate 161. Specifically, when at least one semiconductor light-emitting element 150' seated between the barrier walls 340 disposed on the repair substrate 300 satisfies a preset condition, the controller 172 may cut off power applied to the pair electrodes 320 adjacent to the semiconductor light-emitting element 150'.

Here, the preset condition may indicate that a semiconductor light-emitting element 150' seated on the repair substrate 300 is not damaged. The controller 172 may determine whether the semiconductor light-emitting element 150' placed on the repair substrate 300 is damaged based on a sensing result of the image sensor 167. When the semiconductor light-emitting element 150' placed on the repair substrate 300 is not damaged, the controller 172 may control the semiconductor light-emitting element 150' seated on the repair substrate 300 to overlap one region of the assembly substrate 161 on which the semiconductor light-emitting element is to be assembled. To this end, the controller 172 may control the substrate feeding unit to feed the repair substrate 300 to a designated position. Here, the one region of the assembly substrate on which the semiconductor light-emitting element is to be assembled may be one region of the assembly substrate in which mis-assembly has occurred.

After the semiconductor light-emitting element 150' seated on the repair substrate overlaps the one region of the assembly substrate on which the semiconductor light-emitting element is to be assembled, the controller 172 may cut off power applied to the pair electrodes. Accordingly, the electric field generated around the semiconductor light-emitting element 150' seated on the repair substrate may disappear. At this time, the controller 172 may keep applying power to the assembly electrodes. As a result, the semiconductor light-emitting element 150' seated on the repair substrate may be moved to the assembly substrate and then seated at a preset position.

Next, one implementation of discarding a semiconductor light-emitting element seated on the repair substrate will be described. Referring to FIG. 13, some semiconductor light-emitting elements 150" may be mis-assembled after self-assembly is completed. The mis-assembled semiconductor light-emitting elements may be moved to the repair substrate 300 due to the electric field generated on the repair substrate 300 and seated between the barrier walls 340.

When at least one semiconductor light-emitting element seated between the barrier walls 340 disposed on the repair substrate 300 is damaged, the controller 172 may control the substrate feeding unit so that the repair substrate is spaced apart from the assembly substrate. Thereafter, the semiconductor light-emitting element 150" seated on the repair substrate may be removed. Here, the controller 172 may determine whether the semiconductor light-emitting element 150" seated on the repair substrate is damaged based on a sensing result of the image sensor 167.

Figure 14:
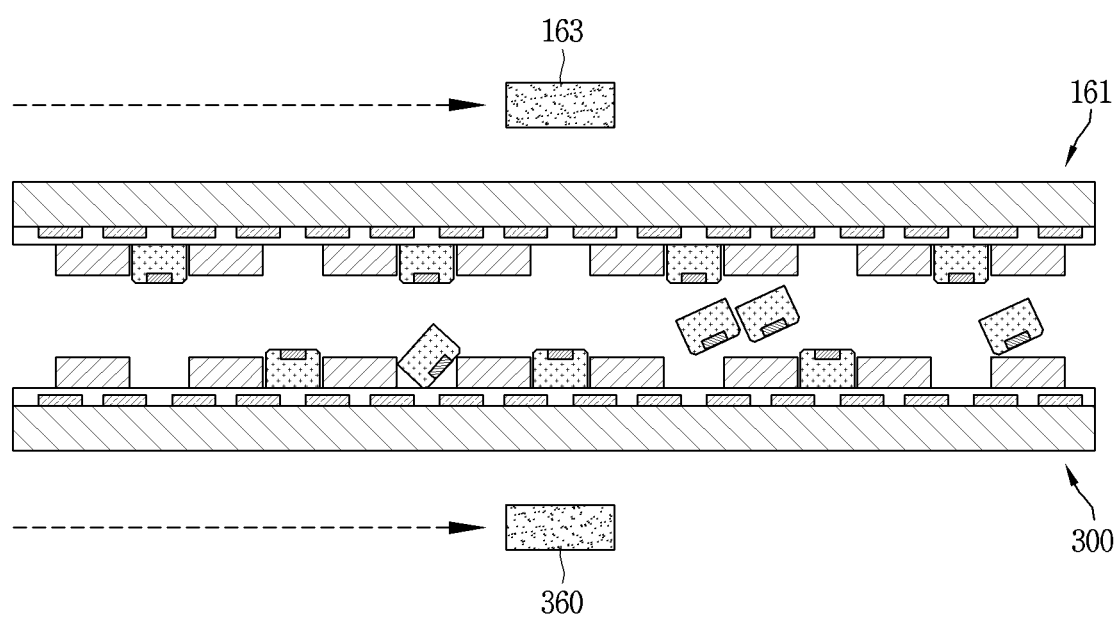
FIG. 14 is a conceptual view illustrating an implementation of using a magnetic force for removing mis-assembled semiconductor light-emitting elements.

Meanwhile, as illustrated in FIG. 14, a magnet 360 may be disposed in a direction opposite to one surface of the repair substrate 300 that faces the assembly substrate 161. In addition, a feeding (or conveyance) unit capable of feeding (or conveying) the magnet 360 may be disposed in the fluid chamber. The feeding unit may feed the magnet 360 to a position where an assembly defect has occurred, so that a magnetic force generated by the magnet 360 can be applied to the mis-assembled semiconductor light-emitting element. This can facilitate the mis-assembled semiconductor light-emitting element to be moved to the repair substrate 300.

As described above, in the present disclosure, mis-assembled semiconductor light-emitting elements in a fluid can be removed, reused, or discarded using electric and magnetic forces. According to the present disclosure, since a physical contact with semiconductor light-emitting elements in the process of removing mis-assembled semiconductor light-emitting elements does not occur, an assembly defect can be resolved without damaging the semiconductor light-emitting elements.

In addition, since the mis-assembled semiconductor light-emitting elements can be reassembled immediately after being collected, costs and time required for resolving assembly defects can be reduced.

The invention claimed is:

1. A self-assembly apparatus for semiconductor light-emitting elements, the apparatus comprising:
 a fluid chamber having a space for accommodating a fluid and the semiconductor light-emitting elements;
 a conveyor configured to convey an assembly substrate so that one surface of the assembly substrate is immersed in the fluid, the assembly substrate having a plurality of assembly electrodes;
 a magnet array spaced apart from the fluid chamber to apply a magnetic force to the semiconductor light-emitting elements;
 a power supply configured to apply power to the plurality of assembly electrodes disposed on the assembly substrate so that the semiconductor light-emitting elements are seated in a preset region on the assembly substrate; and
 a repair substrate disposed to face the one surface of the assembly substrate and including a plurality of pair electrodes on which an electric field is generated as power is supplied,
 wherein the plurality of pair electrodes are disposed at the same interval as the plurality of assembly electrodes.

2. The apparatus of claim 1, further comprising a controller configured to control the power supply,
 wherein the controller controls the power supply to supply power to at least some of the plurality of pair electrodes so that some of the semiconductor light-emitting elements seated at preset positions on the assembly substrate are moved to the repair substrate after the semiconductor light-emitting elements are seated at the preset positions on the assembly substrate.

3. The apparatus of claim 2, wherein the controller selectively applies power only to some of the plurality of pair electrodes that are adjacent to a region where an assembly defect has occurred in an overall region of the assembly substrate.

4. The apparatus of claim 3, further comprising a substrate feeder disposed in the fluid chamber and configured to feed the repair substrate to the fluid.

5. The apparatus of claim 2, wherein the controller applies power to the plurality of assembly electrodes while applying power to the at least some of the plurality of pair electrodes.

6. The apparatus of claim 5, wherein the controller applies power to at least some of the plurality of pair electrodes so that a strength of an electric field generated between the at least some of the plurality of pair electrodes is greater than a strength of an electric field generated between the plurality of assembly electrodes.

7. The apparatus of claim 2, wherein the repair substrate comprises barrier walls for guiding the semiconductor light-emitting elements, and
 wherein the controller applies power to at least some of the plurality of pair electrodes so that some of the semiconductor light-emitting elements seated on the assembly substrate are seated between the barrier walls disposed on the repair substrate.

8. The apparatus of claim 7, wherein when at least one of the semiconductor light-emitting elements seated between the barrier walls disposed on the repair substrate satisfies a preset condition, the controller cuts off power applied to the plurality of pair electrodes adjacent to the at least one semiconductor light-emitting element that satisfies the preset condition.

9. The apparatus of claim 8, wherein the controller cuts off power applied to the plurality of pair electrodes adjacent to the at least one semiconductor light-emitting element satisfying the preset condition, in a state where the at least one semiconductor light-emitting element satisfying the preset condition overlaps a region in which any semiconductor light-emitting element is not seated in the preset region of the assembly substrate.

10. The apparatus of claim 8, further comprising an image sensor configured to monitor the repair substrate,
 wherein the controller cuts off power applied to the plurality of pair electrodes adjacent to the at least one semiconductor light-emitting element satisfying the preset condition, based on a sensing result of the image sensor.

11. A method for assembling semiconductor light-emitting elements in a fluid chamber accommodating a fluid and the semiconductor light-emitting elements, the method comprising:
 feeding an assembly substrate so that one surface of the assembly substrate is immersed in the fluid, the assembly substrate having a plurality of assembly electrodes;
 generating an electric field between the plurality of assembly electrodes to guide a movement of the semiconductor light-emitting elements in the fluid chamber and assemble the semiconductor light-emitting elements at preset positions on the assembly substrate by using a magnetic substance;

feeding a repair substrate to overlap the assembly substrate, the repair substrate having a plurality of pair electrodes; and generating an electric field between the plurality of pair electrodes so that a semiconductor light-emitting element that is mis-assembled from among the semiconductor light-emitting elements on the assembly substrate is moved to the repair substrate.

12. The method of claim 11, further comprising:

cutting off the electric field generated between the plurality of pair electrodes, so that the semiconductor light-emitting element moved to the repair substrate is moved back to the assembly substrate, when the semiconductor light-emitting element moved to the repair substrate satisfies a preset condition.

13. The method of claim 11, further comprising:

determining whether the semiconductor light-emitting element that is mis-assembled is damaged; and one of moving the semiconductor light-emitting element from the repair substrate to the assembly substrate when the semiconductor light-emitting element is not damaged, or moving the repair substrate away from the assembly substrate when the semiconductor light-emitting element is damaged so that the semiconductor light-emitting element is not moved from the repair substrate to the assembly substrate.

14. The method of claim 13, wherein the moving of the repair substrate away from the assembly substrate when the semiconductor light-emitting element is damaged includes moving the repair substrate sideways relative to the assembly substrate.

15. The apparatus of claim 10, wherein the image sensor generates a sensing result that is used to determine whether the at least one semiconductor light-emitting element satisfying the preset condition is damaged.

16. A self-assembly apparatus for semiconductor light-emitting elements, the self-assembly apparatus comprising:

a fluid chamber configured to accommodate a fluid and the semiconductor light-emitting elements;

a conveyor configured to convey an assembly substrate and a repair substrate relative to the fluid chamber, the assembly substrate including a plurality of assembly electrodes and the repair substrate including a plurality of pair electrodes;

a magnet array spaced apart from the fluid chamber, and configured to apply a magnetic force to the semiconductor light-emitting elements in the fluid chamber; and a power supply configured to selectively apply power to the plurality of assembly electrodes so that the semiconductor light-emitting elements are seated in a preset region on the assembly substrate, and to selectively apply power to the plurality of pair electrodes so that any of the semiconductor light-emitting elements that is mis-assembled on the assembly substrate is moved to the repair substrate.

17. The self-assembly apparatus of claim 16, wherein the assembly substrate includes a plurality of assembly grooves to accommodate the semiconductor light-emitting elements, wherein the repair substrate includes a plurality of repair grooves to accommodate any of the semiconductor light-emitting elements that is mis-assembled, and wherein any of the semiconductor light-emitting elements that is mis-assembled is moved to the repair substrate when the plurality of assembly grooves and the plurality of repair grooves are aligned.

18. The self-assembly apparatus of claim 16, further comprising an image sensor configured to monitor the repair substrate, wherein a sensing result of the image sensor is used to determine whether any of the semiconductor light-emitting elements that is mis-assembled is damaged.

19. The self-assembly apparatus of claim 18, wherein the self-assembly apparatus is configured to move the repair substrate away from the assembly substrate when any of the semiconductor light-emitting elements that is mis-assembled is damaged so that the semiconductor light-emitting element that is damaged is not moved from the repair substrate to the assembly substrate.

20. The self-assembly apparatus of claim 16, further comprising another magnet array configured to apply a magnetic force to any of the semiconductor light-emitting elements that is mis-assembled to move the mis-assembled semiconductor light-emitting element from the assembly substrate to the repair substrate.

* * * * *